United States Patent [19]

Mukherjee et al.

[11] 4,003,005
[45] Jan. 11, 1977

[54] BIDIRECTIONAL CONSTANT IMPEDANCE LOW PASS/HIGH PASS FILTER CIRCUIT

[75] Inventors: Samir Mukherjee, Scottsville, N.Y.; William Ford Shepherd, Raleigh, N.C.

[73] Assignee: Electro Networks, Division of Chloride, Inc. N. American Operations, Tampa, Fla.

[22] Filed: Nov. 24, 1975

[21] Appl. No.: 634,351

[52] U.S. Cl. .................................. 333/8; 333/32; 333/70 R; 333/77
[51] Int. Cl.² .................. H03H 7/04; H03H 7/38; H03H 7/46
[58] Field of Search ............ 333/70 R, 1, 77, 78, 333/28, 8, 6, 32

[56] References Cited

UNITED STATES PATENTS

| | | | |
|---|---|---|---|
| 1,615,252 | 1/1927 | Zobel | 333/70 R X |
| 3,449,696 | 6/1969 | Routh | 333/28 X |
| 3,737,813 | 6/1973 | Buecherl | 333/8 X |
| 3,794,936 | 2/1974 | Poschenrieder et al. | 333/28 R |
| 3,922,623 | 11/1975 | Bucherl | 333/70 R X |

*Primary Examiner*—Alfred E. Smith
*Assistant Examiner*—Marvin Nussbaum
*Attorney, Agent, or Firm*—Finnegan, Henderson, Farabow & Garrett

[57] ABSTRACT

A bidirectional filter circuit having an input and an output and substantially constant input and output impedance characteristics over the desired frequency range. A low-pass filter network is connected between filter input and output and has identical low-pass filter half sections cascaded back-to-back with a symmetrical all-pass network interposed therebetween, the all-pass network providing isolation between the low-pass filter half sections and the desired terminating impedance therefor. First and second identical compensating networks are respectively connected to the filter input and output and have reciprocal characteristic functions with respect to the low-pass filter half sections to compensate for impedance changes in the low-pass filter half sections over the desired frequency range without affecting amplitude characteristics thereof. A high-pass filter network is connected between filter input and output and has identical high-pass filter half sections cascaded back-to-back with a symmetrical all-pass network interposed therebetween, the all-pass network providing isolation between the high-pass filter half sections and the desired terminating impedance therefor. Third and fourth identical compensating networks are respectively connected to the filter input and output and have reciprocal characteristic functions with respect to the high-pass filter half sections to compensate for impedance changes in the high-pass filter half sections over the desired frequency range without affecting amplitude characteristics thereof.

10 Claims, 5 Drawing Figures

BIDIRECTIONAL CONSTANT IMPEDANCE LOW PASS/HIGH PASS FILTER CIRCUIT

BACKGROUND OF THE INVENTION

1. Field of the Invention

The subject invention relates to a bidirectional filter circuit having low-pass and high-pass filter channels connected between filter input and output to provide constant input/output impedance characteristics. The filter circuit of the invention has particular utility in applications requiring constant impedance characteristics, such as telephone lines, data transmission lines, alarm system lines, and the like.

2. Description of the Prior Art

The use of bidirectional filters generally having high and low-pass branches is known in the art. Zobel U.S. Pat. No. 1,615,252 discloses parallel connected high-pass and low-pass filters, with a repeater interposed in the high-pass branch. The Zobel patent relates to the use of filtering circuits in a transmission line and discloses the use of resistance networks as compensating networks.

Fry U.S. Pat. No. 1,559,864 relates to a filtering circuit having parallel connected low-pass and high-pass filter branches to give sharply defined boundaries to the transmitted bands or ranges of frequencies. Also note Herbert, Jr. U.S. Pat. No. 3,771,064 and Poschenrieder et al U.S. Pat. No. 3,794,936 which generally relate to high-pass and low-pass filter networks connected in parallel. The Herbert, Jr. patent particularly shows a bidirectional signal processing means for use in the television frequency range utilizing filter units and amplification means. The Whittle U.S. Pat. No. 2,041,098, Norton U.S. Pat. No. 2,076,248 and Bode U.S. Pat. No. 2,301,245 also disclose filter circuits having low-pass and high-pass filter branches connected between input and output.

Purlington U.S. Pat. No. 2,762,018 discloses the utilization of reactance networks having structural symmetry. U.S. Pat. No. 2,260,494 to Terroni discloses designing filters having substantially constant impedance over a broad range and the use of compensating networks.

SUMMARY OF THE INVENTION

The advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of this invention, as embodied and broadly described herein, the bidirectional filter circuit of the invention preferably comprises low and high-pass filter networks connected between filter circuit input and output, the low-pass filter network having first and second identical low-pass filter half sections connected back-to-back in cascade arrangement with a symmetrical all pass network interposed therebetween, the high-pass filter network having first and second identical high-pass filter half sections connected back-to-back in cascade arrangement with a symmetrical all pass network interposed therebetween, and individual compensating networks flanking each of the low-pass and high-pass filter half sections and having reciprocal characteristic functions relative thereto.

Although the prior art generally discloses parallel connected low-pass and high-pass filter networks and compensating networks, the particular filter circuit here disclosed is not taught or suggested in the prior art known to applicants.

The bidirectional filter circuit according to the invention provides substantially constant input and output impedance characteristics within a given tolerance range throughout the frequency band of interest, including the transition range between low and high frequencies, without affecting amplitude response of either low-pass or high-pass network.

The combination low-pass/high-pass bidirectional filter of the invention may be included in a single compact package and is particularly useful, for example, in audio systems in which filtering is required and a mismatch of impedances at input and output terminals cannot be tolerated for processing signals. However, the invention is not limited to such use and has other applications.

Preferably the low-pass and high-pass filter networks comprise passive reactive elements.

It is also preferred that the compensating networks comprise passive reactive elements.

It is also preferred that the compensating networks have terminating resistive impedances equal to the terminating impedances of the associated filter half sections.

It is further preferred that the compensating networks have reciprocal characteristic functions relative to the filter half sections which they flank.

It is still further preferred that the filter half sections be isolated by and matched by a symmetrical all pass network comprising a resistive pad.

The invention consists in the novel parts, constructions, arrangements, combinations and improvements shown and described. The accompanying drawings, which are incorporated in and constitute a part of this specification, illustrate one embodiment of the invention and, together with the description, serve to explain the principles of the invention.

DETAILED DESCRIPTION OF THE INVENTION

Reference will not be made in detail to the present preferred embodiment of the invention, an example of which is illustrated in the accompanying drawings.

Figure 1:
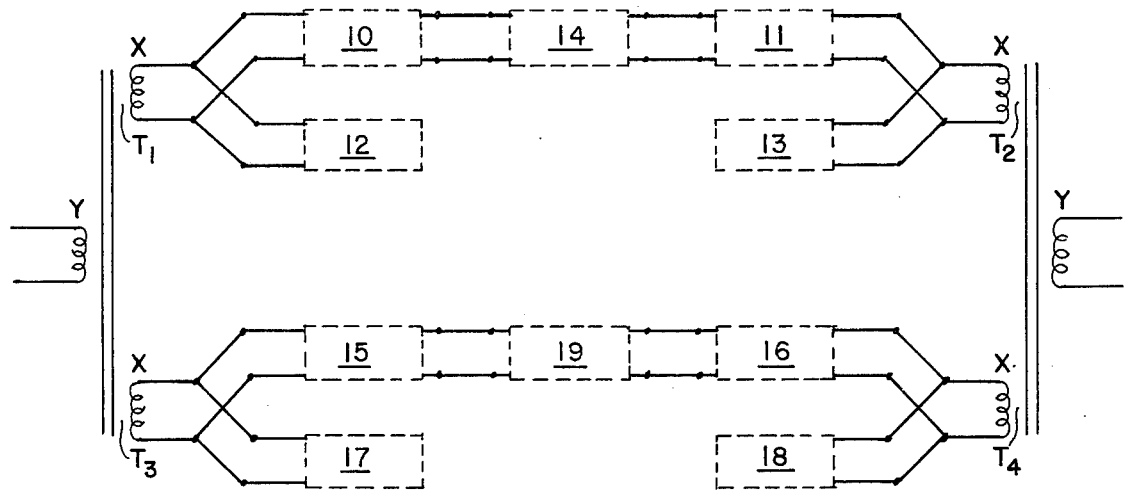
FIG. 1 is a block diagram of the filter circuit of the invention illustrating the interconnections of the low and high-pass filter half sections, the symmetrical all pass networks and the compensating networks.

FIG. 1 generally shows the connection of the high-pass and low-pass filter networks of the bidirectional filter circuit of the invention in a transformer coupled system. Each of the high and low-pas filter networks comprises two identical half filter sections. The low-pass filter network comprises identical half filter sections 10 and 11 cascaded back to back with a symmetrical all pass network 14 interposed therebetween. Each of the low-pass filter half sections 10 and 11 has amplitude characteristics which is half the value of the entire low-pass filter network amplitude characteristic throughout the frequency band. The symmetrical all pass network 14 functions to isolate the low-pass half filter sections 10 and 11 and provides the design impedance termination required therefor. The symmetrical all pass network may preferably comprise a resistive pad.

The high-pass filter network similarly comprises two identical high-pass half filter sections 15 and 16, with a symmetrical all pass network 19 interposed therebetween.

Impedance compensating networks are connected in flanking relationship with the filter half sections to compensate for variations in impedance thereof over the frequency range without affecting their amplitude characteristics. Thus with respect to the low-pass filter network, compensating networks 12 and 13 respectively flank low-pass filter half sections 10 and 11. Similarly with respect to the high-pass filter network, impedance compensating networks 17 and 18 respectively flank high-pass filter half sections 15 and 16. The impedance compensating networks have reciprocal characteristic functions relative to the characteristic functions of the filter half sections which they flank.

Figure 2A:
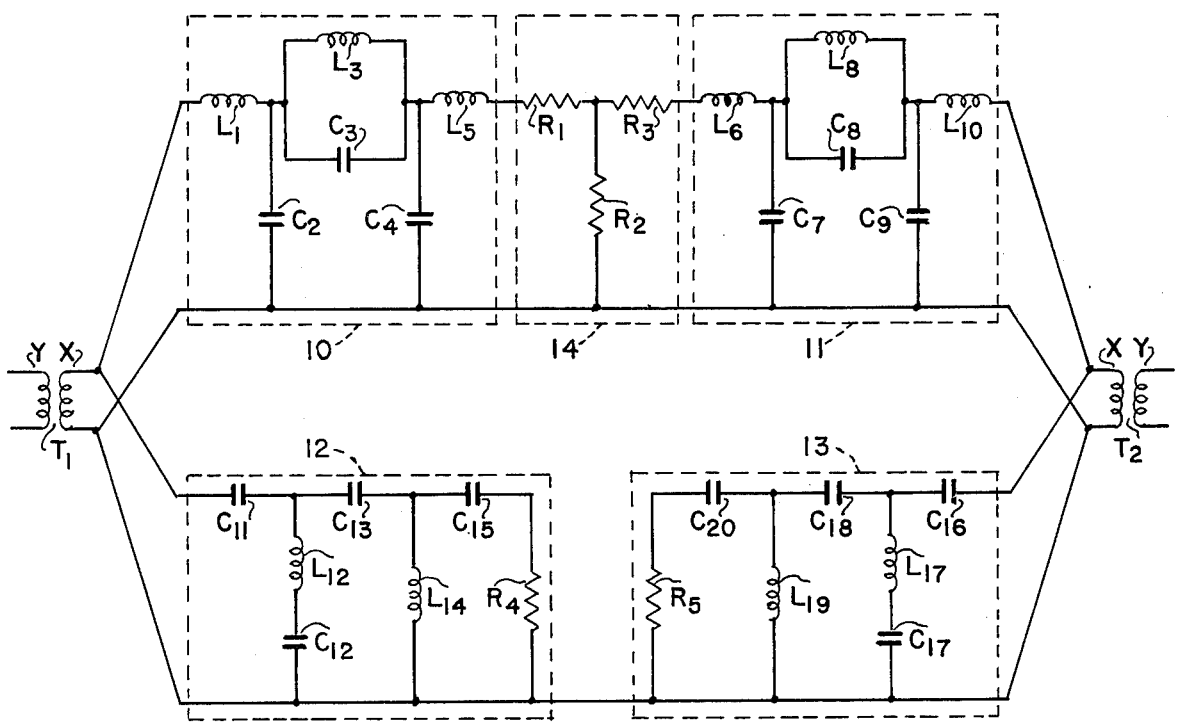
FIG. 2 is a detailed schematic diagram of the filter circuit of FIG. 1, with FIG. 2 (a) illustrating the low-pass filter channel and FIG. 2 (b) illustrating the high-pass filter channel.
Figure 2B:
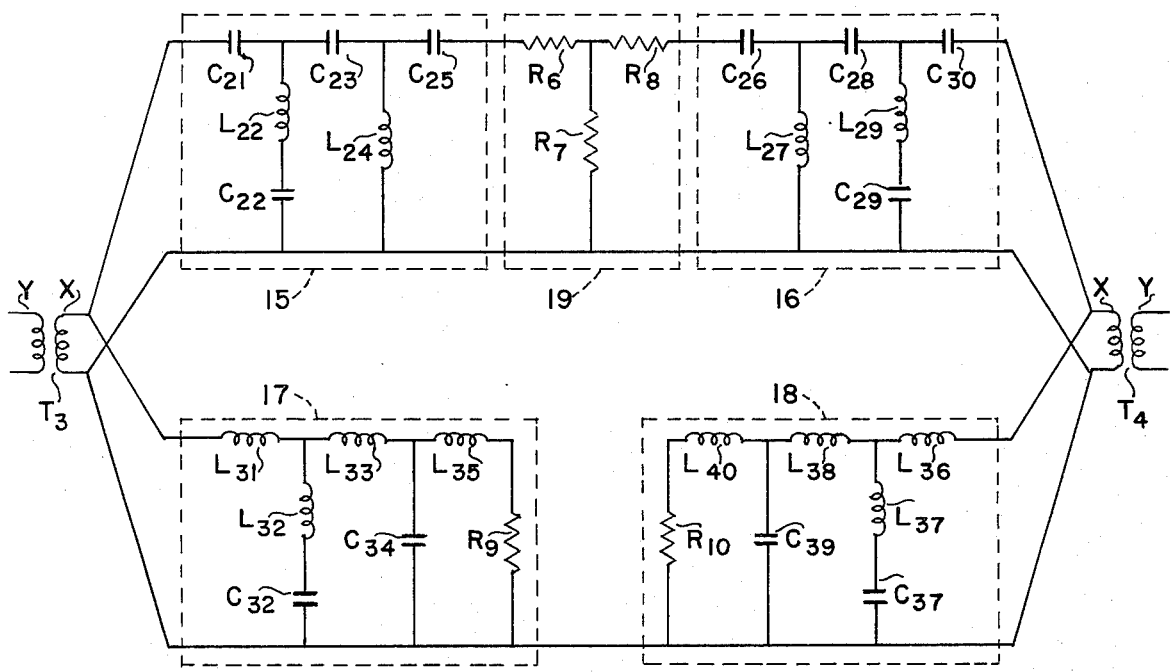

FIGS. 2(a) and 2(b) show the filter system according to the invention in more specific detail. The filter half sections are synthesized in accordance with conventional modern design synthesis procedure. In accordance with the invention, low-pass filter half section 10 comprises capacitors C2, C3 and C4, and inductors L1, L3 and L5 connected to winding "X" of transformer T1. An identical low-pass half filter section 11 comprising capacitors C7, C8 and C9, and inductors L6, L8 and L10 is connected to winding "X" of transformer T2. The low-pass filter half sections 10 and 11 are connected back to back in cascaded manner. As here embodied, a resistive pad 14 comprising resistors R1, R2 and R3 arranged in "T" configuration are interposed therebetween. The low-pass filter network with interposed pad 14 is thus connected between the "X" windings of transformers T1 and T2.

In accordance with the invention, compensating networks flank each of the low-pass filter half sections. It is thus seen that compensating network 12 is connected to the "X" winding of transformer T1 and comprises capacitors C11, C12, C13, and C15, and inductors L12, and L14. An identical compensating network 13 flanks low-pass half filter section 11, and is shown as comprising capacitors C16, C17, C18, and C20, and inductors L17 and L19 connected to the "X" winding of transformer T2.

As here embodied, the characteristic functions of the compensating networks 12 and 13 are identical and are exact reciprocals of the characteristic functions of the low-pass filter half sections 10 and 11. The compensating networks 12 and 13 function to compensate for changes in impedance of the low-pass filter half sections 10 and 11 over the frequency range of interest, without causing an affect on amplitude characteristics. Compensating networks 12 and 13 have resistive terminations R4 and R5 respectively. Since the function of the compensating networks 12 and 13 is only to compensate for changes in impedance over the frequency range without causing amplitude variations, they need not be cascaded with or isolated from each other.

In accordance with the invention, the high-pass filter network similarly comprises high-pass filter half sections connected between transformers T3 and T4. The high-pass filter half section 15 connected to the "X" winding of transformer T3 comprises capacitors C21, C22, C23, and C25, and inductors L22 and L24.

An identical high-pass filter half section 16 is connected to winding "X" of transformer T4 and comprises capacitors C26, C28. C29 and C30, and inductors L27 and L29. Compensating networks also flank the high-pass half filter sections. Thus compensating network 17 comprising inductors L31, L32, L33 and L35, and capacitors C32 and C34 is connected to the "X" winding of transformer T3. An identical compensating network 18 flanks high-pass half filter section 16 and comprises inductors L36, L37, L38 and L40, and capacitors C37 and C39 connected to the "X" winding of transformer T4. Resistors R9 and R10 respectively are the termination impedances for the compensating networks 17 and 18. As described above with respect to the low-pass filter network, the compensating networks 17 and 18 associated with the high-pass filter network need not be cascaded with or isolated from each other. A resistive pad 19 comprising resistors R6, R7 and R8 arranged in "T" configuration is interposed between high-pass filter half sections 15 and 16 to isolate the latter and provide the required termination impedances.

Thus each filter half sections requires a resistive load which is the input and output impedance or termination. To obtain the total desired amplitude characteristics, the two half sections of each filter network (low-pass and high-pass) must be cascaded, and to maintain the proper load for each half section, the two half sections must be isolated such that each network essentially looks into the design termination required for each section.

Figure 3:
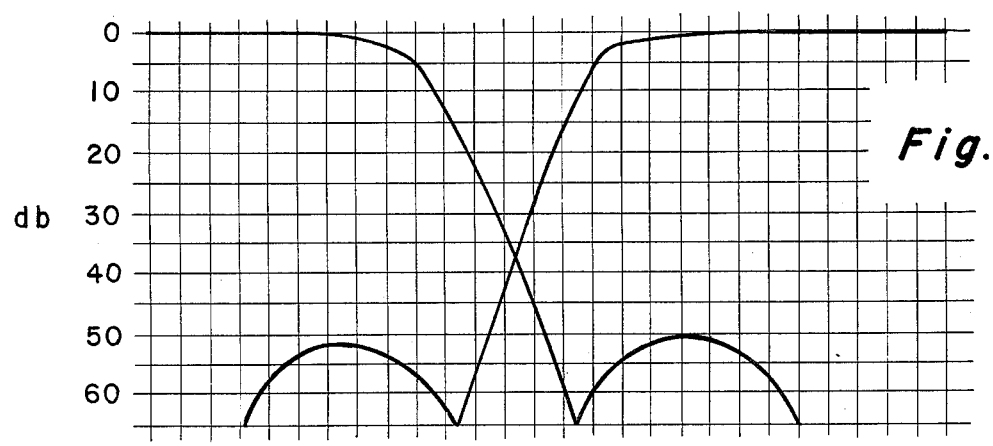
FIG. 3 is a graph of typical amplitude versus frequency characteristics of the low-pass and high-pass channels according to the invention.
Figure 4:
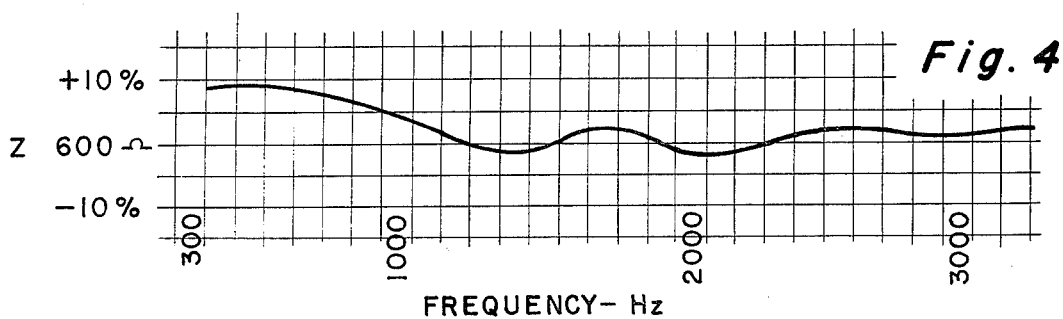
FIG. 4 is a graph showing typical input and output impedance characteristics versus frequency of the filter circuit according to the invention.

FIG. 3 is a graph of typical amplitude versus frequency characteristics for a low-pass/high-pass filter circuit according to the invention with a crossover frequency at 1500 Hz. FIG. 4 is a corresponding graph of input and output impedance versus frequency characteristics, assuming a desired input/output impedance of 600 ohms. It is seen that the input/output impedance remains within ± 10% of 600 ohms over the frequency range of interest, and particularly in the crossover region.

The particular low-pass and high-pass networks are synthesized by the conventional modern design synthesis procedure depending upon the frequency range of interest, the amplitude versus frequency response desired, and the input/output impedance values.

For illustrative purposes only, typical values for the filter elements with an input/output impedance of 600 ohms are as follows:

| | |
|---|---|
| C2 | .2534 μF |
| C3 | .1518 μF |
| C4 | .1531 μF |
| C7 | .1531 μF |
| C8 | .1518 μF |
| C9 | .2534 μF |
| C11 | .1856 μF |
| C12 | .0642 μF |
| C13 | .3189 μF |
| C15 | .4877 μF |
| C16 | .1856 μF |

| | -continued |
|---|---|
| C17 | .0642 μF |
| C18 | .3189 μF |
| C20 | .4877 μF |
| C21 | .1322 μF |
| C22 | .200 μF |
| C23 | .1173 μF |
| C25 | .2447 μF |
| C26 | .2447 μF |
| C28 | .1173 μF |
| C29 | .200 μF |
| C30 | .1322 μF |
| C32 | .0537 μF |
| C34 | .1465 μF |
| C37 | .0537 μF |
| C39 | .1465 μF |
| L1 | 100.6 mH |
| L3 | 50.5 mH |
| L5 | 40.3 mH |
| L6 | 40.3 mH |
| L8 | 50.5 mH |
| L10 | 100.6 mH |
| L12 | 211.8 mH |
| L14 | 65.1 mH |
| L17 | 211.8 mH |
| L19 | 65.1 mH |
| L22 | 58.7 mH |
| L24 | 39.0 mH |
| L27 | 39.0 mH |
| L29 | 58.7 mH |
| L31 | 51.4 mH |
| L32 | 118.6 mH |
| L33 | 33.8 mH |
| L35 | 19.7 mH |
| L36 | 51.4 mH |
| L37 | 118.6 mH |
| L38 | 33.8 mH |
| L40 | 19.7 mH |
| R1 | 200 ohms |
| R2 | 806 ohms |
| R3 | 200 ohms |
| R4 | 600 ohms |
| R5 | 600 ohms |
| R6 | 200 ohms |
| R7 | 806 ohms |
| R8 | 200 ohms |
| R9 | 600 ohms |
| R10 | 600 ohms |

The transformer coupling arrangement shown in FIGS. 1; 2(a) and 2(b) are only illustrative of one coupling arrangement and others may be used with the filter circuit according to the invention.

It will be apparent to those skilled in the art that various modifications and variations may be made in the filter circuit of the invention without departing from the scope or spirit of the invention.

What is claimed is:

1. A bidirectional filter circuit having an input and an output and substantially constant input and output impedance characteristics over the desired frequency range, comprising:
    a low-pass filter network connected between filter input and output having identical low-pass filter half sections cascaded back-to-back with a symmetrical all-pass network interposed therebetween, the all-pass network providing isolation between the low-pass filter half sections and the desired terminating impedance therefor,
    first and second identical compensating networks respectively connected to the filter input and output and having reciprocal characteristic functions with respect to the low-pass filter half sections to compensate for impedance changes in the low-pass filter half sections over the desired frequency range without affecting amplitude characteristics thereof,
    a high-pass filter network connected between filter input and output having identical high-pass filter half sections cascaded back-to-back with a symmetrical all-pass network interposed therebetween, the all-pass network providing isolation between the high-pass filter half sections and the desired terminating impedance therefor,
    third and fourth identical compensating networks respectively connected to the filter input and output and having reciprocal characteristic functions with respect to the high-pass filter half sections to compensate for impedance changes in the high-pass filter half sections over the desired frequency range without affecting amplitude characteristics thereof.

2. The filter circuit recited in claim 1 wherein the first, second, third and fourth compensating networks comprise passive reactive elements, each having a terminating resistive impedance equal to the input and output impedance terminations of the filter circuit.

3. The filter circuit recited in claim 1 wherein the low-pass and high-pass networks comprise passive reactive elements.

4. The filter circuit recited in claim 1 wherein the symmetrical all-pass network comprises a resistive pad.

5. The filter circuit recited in claim 1 wherein the filter input and output comprises individual input and output transformer windings for each of the low-pass and high pass filter networks, a first common winding coupled to the input transformer windings, and a second common winding coupled to the output transformer windings for transmitting signals to the filter circuit.

6. The filter circuit recited in claim 5 wherein the first, second, third and fourth compensating networks comprise passive reactive elements, each having a terminating resistive impedance equal to the input and output impedance terminations of the filter circuit.

7. The filter circuit recited in claim 6 wherein the low-pass and high-pass networks comprise passive reactive elements.

8. The filter circuit recited in claim 7 wherein the symmetrical all-pass network comprises a resistive pad.

9. The filter circuit recited in claim 2 wherein the low-pass and high-pass networks comprise passive reactive elements.

10. The filter circuit recited in claim 5 wherein the symmetrical all-pass network comprises a resistive pad.

* * * * *